United States Patent [19]
Williams et al.

[11] Patent Number: 5,568,521
[45] Date of Patent: Oct. 22, 1996

[54] PHASE LOCK INDICATOR CIRCUIT FOR A HIGH FREQUENCY RECOVERY LOOP

[75] Inventors: Bruce H. Williams, Sandy; Glenn A. Arbanas; Roy E. Greeff, both of Salt Lake City, all of Utah

[73] Assignee: Unisys Corporation, Blue Bell, Pa.

[21] Appl. No.: 137,244

[22] Filed: Sep. 16, 1993

[51] Int. Cl.⁶ .................................................. H03D 3/24
[52] U.S. Cl. ........................ 375/344; 375/327; 375/373; 375/376
[58] Field of Search ..................... 375/97, 119, 120, 375/118, 81, 82, 83, 84, 85, 52, 53, 54, 344, 373, 376, 371, 327, 328, 329, 330, 331, 279, 280, 281; 331/DIG. 2, 4, 25, 11, 12; 329/308, 305, 304, 309; H03D 3/24

[56] References Cited

U.S. PATENT DOCUMENTS

| | | | |
|---|---|---|---|
| 4,048,566 | 9/1977 | Carson et al. | 325/329 |
| 4,344,178 | 8/1982 | Waters | 375/81 |
| 4,475,218 | 10/1984 | Takeda et al. | 375/81 |
| 4,795,986 | 1/1989 | Ceroni | 329/124 |
| 4,856,027 | 8/1989 | Nakamura et al. | 375/81 |
| 4,870,382 | 9/1989 | Keate et al. | 375/81 |
| 4,871,975 | 10/1989 | Nawata et al. | 375/81 |
| 4,901,332 | 2/1990 | Williams et al. | 329/308 |
| 5,063,577 | 11/1991 | Arbanas et al. | 375/376 |
| 5,121,071 | 6/1992 | Kelly et al. | 331/DIG. 2 |

*Primary Examiner*—Kim Yen Vu
*Assistant Examiner*—Madeleine Anh-Vinh Nguyen
*Attorney, Agent, or Firm*—John B. Sowell; Mark T. Starr; Thomas J. Scott

[57] ABSTRACT

An improved phase locked indication circuit for a Costas QPSK carrier recovery loop comprises an inphase channel, a quadrature channel and phase error channel each connected to an input of a three input summing circuit through a diode square law multiplier and wherein the error channel signal is filtered by a low pass filter to smooth the signal before being applied to the negative input of the summing circuit to diminish false lock and not locked signals. The locked and not lock conditions are separated one from the other by a large signal to noise ratio.

9 Claims, 4 Drawing Sheets

PHASE LOCK INDICATOR CIRCUIT FOR A HIGH FREQUENCY RECOVERY LOOP

BACKGROUND OF INVENTION

1. Field of Invention

The present invention is related to lock detectors for High Speed Phase Lock Loops of the type employed in quadrature phase shift key (QPSK) receivers. More particular, the present invention relates to lock detectors that employ low cost components and produce higher signal to noise phase locked indication signals than circuit employed heretofore.

2. Description of the Prior Art

The state of the prior art QPSK phase lock detectors will be described in more detail in the description of the prior art drawings. The prior art includes Costas type signal tracking loops which includes hard limiters, analog multipliers and square law multipliers.

The problem with such low speed prior art lock detectors is that they produce low signal to noise phase locked indication signals which are susceptible to generation of false locked signals.

It would be desirable to provide a phase lock detection circuit which comprises high speed and low cost components which generate a higher signal to noise ratio phase locked indication signal than circuits employed heretofore to eliminate false locked signals.

SUMMARY OF THE INVENTION

It is a principle object of the present invention to provide an improved lock detection circuit for a QPSK carrier recovery loop.

It is a principle object of the present invention to provide a novel lock detection circuit for a Costas QPSK phase lock loop that produces an enhanced phase locked indication signal.

It is the principle object of the present invention to provide an improved lock detection circuit comprising low cost high speed square law multiplier components which are small and reliable.

It is another principle object of the present invention to provide an improved diode square law multiplier device which incorporates a low pass filtering feature.

It is another object of the present invention to provide a filtering device for smoothing the input to the summing device which generates the phase lock detection signal.

It is another general object of the present invention to provide a novel phase lock detection circuit which provides a larger separation between the locked and not locked signal at the output of the phase locked indication circuit.

According to these and other objects of the present invention there is provided a QPSK Costas carrier recovery loop circuit coupled to a novel phase locked indication circuit comprising an inphase channel, a quadrature channel and a phase error signal channel. A wave smoothing square law multiplier device is placed in series in each channel and the channels are coupled to a three input summing circuit to produce an enhanced signal to noise ratio phase locked indication signal output.

DETAILED DESCRIPTION OF THE PREFERRED EMBODIMENT

Figure 1:
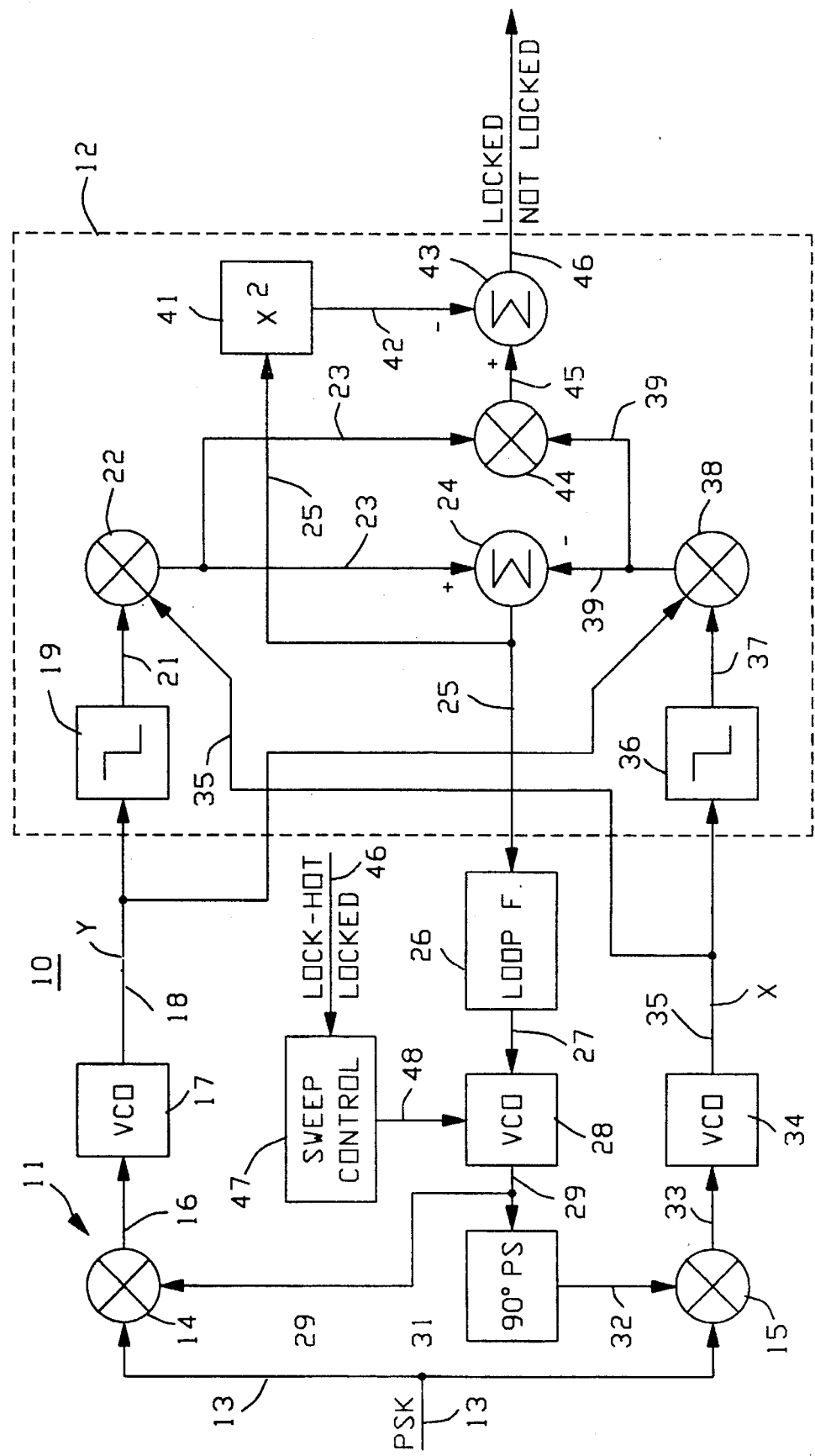
FIG. 1 is a block diagram of a prior art modified Costas type carrier recovery loop circuit and phase locked indicator for a QPSK receiver.

Refer now to FIG. 1 showing a diagram of a block prior art modified Costa type phase locked loop 10 which comprises a quadrature hybrid phase detector 11 and a lock detector 12. A QPSK signal is applied to input line 13 to the quadrature hybrid phase detector 11. The signal on line 13 is applied as an input to mixer 14 which also has an input signal on line 29 from the voltage controller oscillator. The output of mixer 14 on line 16 as applied to a low pass filter 17 to produce an output signal on line 18. The signal on line 18 is a data modulated signal which is identified as signal Y for purposes of explaining the present invention. The data modulated signal on line 18 is applied to a hard limiter 19 to produce a hard limited output signal on line 21 which is applied to an analog multiplier 22. The output of analog multiplier 22 on line 23 is applied to the positive input of a summing circuit 24 to produce an error voltage signal on line 25 which is applied to the loop filter 26. The output of the loop filter 26 on line 27 is applied to the voltage controlled oscillator 28 to control the voltage controlled oscillator 28 and track the incoming carrier signal on line 13. The output of the voltage controlled oscillator on line 29 is applied to mixer 14 to produce the aforementioned signal on line 16 and is also applied to a 90 degree phase shifter 31 whose shifted output signal on line 32 is applied to mixer 15 to produce the quadrature data modulated signal on line 33. The signal on line 33 is a applied low pass filter 34 to produce a filtered data modulated signal (X signal) on line 35 which is applied to a second hard limiter 36 to produce the hard limited data modulated signal on line 37. The signal on line 37 is applied to a second analog multiplier 38 which has a cross-channel data modulated signal from line 18 also applied to produce a cross-channel data modulated product signal on line 39 similar to the cross-channel data product modulated signal on line 23 from analog multiplier 22. The signal on line 39 is applied to the negative input of the summing circuit 24 to produce the aforementioned voltage error signal on line 25 which is employed to control the frequency of the voltage controlled oscillator 28 and produce the locked on or tracking frequency on line 29.

The lock detector 12 is shown including the portion of the QPSK receiver which generates the error voltage signal on line 25 which is employed in the lock detector portion of the QPSK receiver. The output of summing circuit 24 on line 25 is applied to square law multiplier 41 which produces a signal on line 42 that is basically a rectified version of the beat frequency signal on line 25. The signal on line 42 is applied to the negative input of summing circuit 43. A third analog multiplier 44 is shown having input lines 23 and 39 applied-thereto to produce an output signal on line 45 which is applied to the positive input of summing circuit 43 to produce the locked or not locked condition signal on line 46. The locked or not locked condition on line 46 is shown being applied to the sweep control 47 to produce a control signal on line 48 to the voltage controlled oscillator 28 which causes the voltage controlled oscillator to sweep through a predetermined frequency range in an attempt to recover the carrier. When the voltage controlled oscillator is locked on the frequency of the incoming QPSK signal in the this embodiment, the voltage error signal on line 25 is a low DC signal and when the VCO 28 is not locked on the incoming carrier signal a beat note signal appears on line 25. In this embodiment, when the VCO 28 is locked on the incoming carrier signal, the signal on line 46 being applied to the sweep control circuit 47 is a high DC signal and when the not locked condition occurs, the signal on line 46 is substantially zero.

The prior art analog multipliers 22, 38, and 44 are basically limited to frequencies of approximately 50 megahertz at their outputs. The square law multiplier 41 is basically a low frequency analog multiplier which does not require high frequency response but is an expensive component. As will be discussed in detail hereinafter these expensive components and the prior art analog multipliers which limited frequency response of the phase locked loop and lock detector can be eliminated with state of the art low cost small components as will be explained hereinafter.

Figure 2:
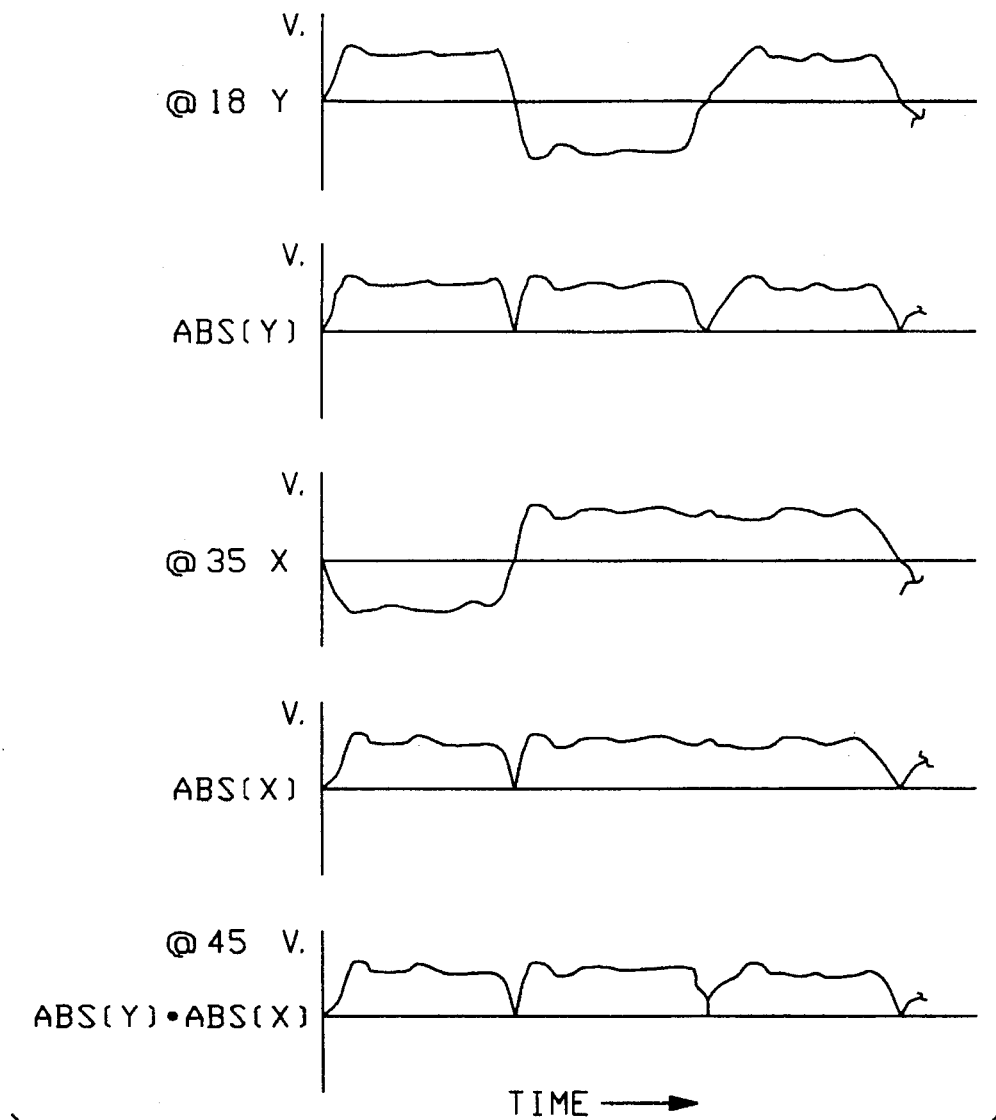
FIG. 2 is a waveform diagram showing the recovered signal being produced in the real and imaginary channels of the carrier recovery loop circuit of FIG. 1.

The first waveform of FIG. 2 is the signal on line 18 which represents a recovered filtered data signal in the Y channel. The multiplication of the hard limited Y signal on line 21 and the filtered signal on line 18 results in an absolute value of Y as shown in the second waveform of FIG. 2. It will be noted that this signal does not appear at any place on FIG. 1 but will be used for comparison purposes for explanation of the present invention. The third waveform of FIG. 2 is the recovered filtered data signal which appears on line 35 and is the imaginary or X channel signal. The fourth waveform of FIG. 2 represents the absolute value of the filtered data signal on line 35 and the signal on line 37. As explained hereinbefore this signal will be used for comparison purposes but it does not appear on any of the lines in FIG. 1. When the absolute value of Y shown as the second waveform and the absolute value of X shown as the fourth waveform of FIG. 2 are multiplied together the fifth waveform signal is produced by multiplier 44 and produced an output on line 45 as shown in FIG. 2. The absolute value of X and absolute value of Y are coupled to the positive input of the summing circuit 43 to produce the locked or not locked signal on line 46. The negative input to summing circuit 43 on line 42 is the error signal that was produced on line 25 after being multiplied at square law multiplier 41.

Figure 3:
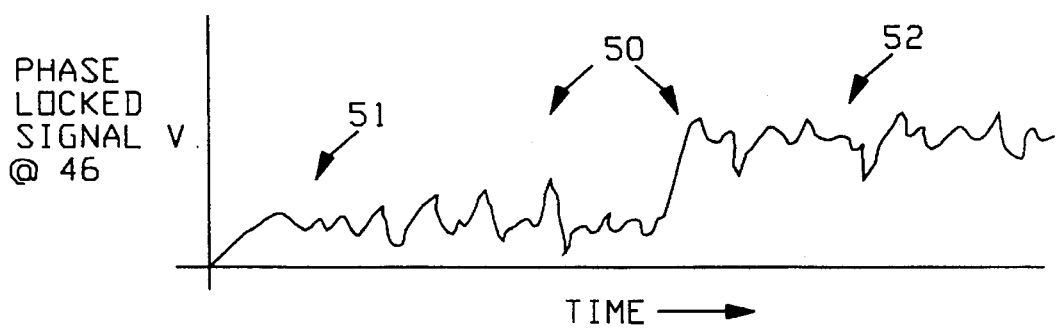
FIG. 3 is a waveform diagram showing a voltage waveform being produced at the output of the phase locked indicator shown at FIG. 1.

Refer now to FIG. 3 showing a voltage waveform produced at the output of the summing circuit 43 on line 46. The first portion of waveform 50 is shown as the not locked portion 51. The lock portion of waveform 50 is shown by numeral 52. It will be noted that the waveform 51 is not smooth and includes amplitude modulations which are sufficient to cause false lock indications signals. Similarly the amplitude modulations shown on waveform 52 can be great enough to reverse the lock indication to show a not locked condition.

Figure 4:
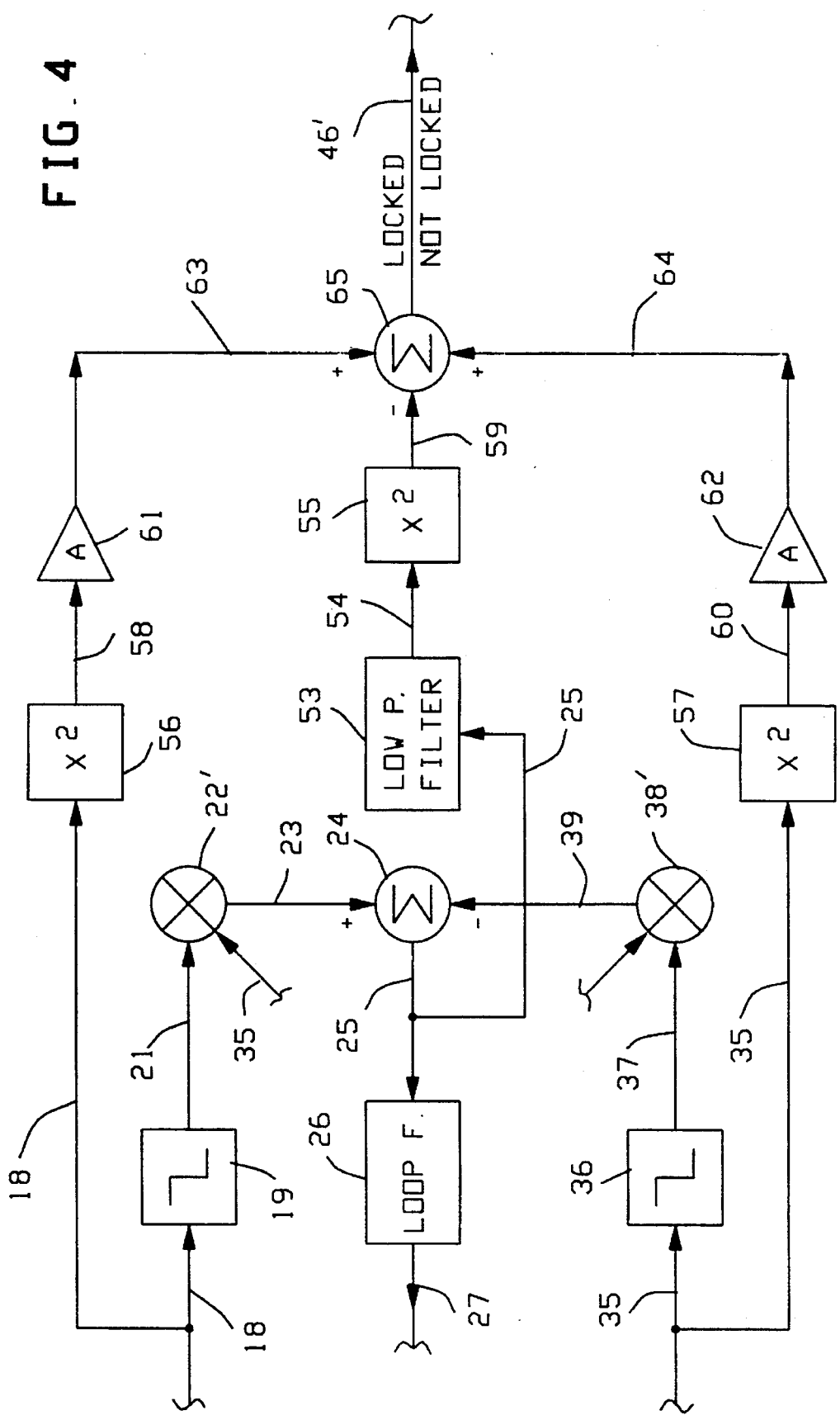
FIG. 4 is a block diagram showing a preferred embodiment of the present invention novel phase locked indicator circuit.

Refer now to FIG. 4 showing a block diagram of the preferred embodiment of the present invention novel phase lock indication circuit. The elements for numerals 18, 19, 21, 23, 24, 25, 26, 27, 35, 36, 37, 39 are numbered the same as the elements in FIG. 1 and are identical to the elements in FIG. 1. The mixers 22' and 38' replace the mixers 22 and 38 shown in FIG. 1. These state of the art mixers are known as double balance mixers and are commercially available from suppliers such as Minicircuits, Inc. under the model designation ASK-1. These state of the art analog multiplier or mixers are capable of accommodating input/output frequencies up to 600 megahertz similar to the analog mixer/ multiplier 38' which is a double balance high frequency mixer that produces an output on line 39 which is applied to the summing circuit 24. The output of the summing circuit 24 on line 25 is applied to the loop filter 26 as explained hereinbefore. The same output on line 25 is now applied as an input to a low pass filter 53 shown as having an output on line 54 applied to a square law multiplier 55. In the preferred embodiment of the present invention, the square law multipliers 55, 56 and 57 comprise diodes having a low band pass frequency characteristic which smooths the output signals on lines 58, 59 and 60. Lines 58 and 60 are shown applied as inputs to amplifiers 61 and 62 which have outputs on lines 63 and 64 respectively. The amplifiers 61 and 62 may be incorporated into a three port summing circuit 65 which reduces the locked or not locked output signal on line 46' instead of being separate components.

In the preferred embodiment of the present invention the low pass filter 53 provides the desirable smoothing of the signal on line 25 and can be further filtered by the diode square law multiplier 55. The low pass filter 53 eliminates the unwanted high frequency components in the error signal. Since this signal is being subtracted in the three input summing circuit 65 it is effective to cause a wider separation between the lock and not locked signal as will be explained in greater detail hereinafter.

Figure 5:
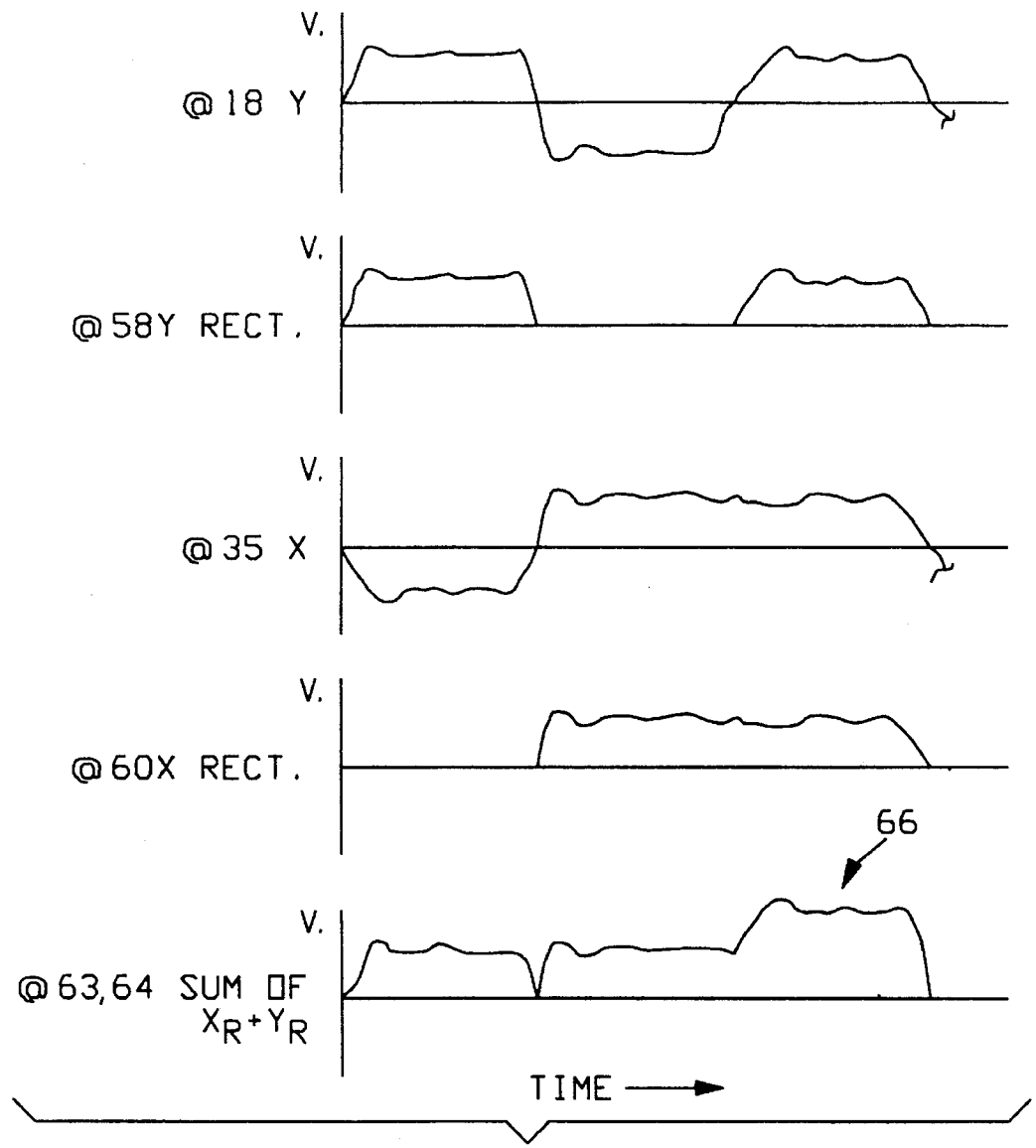
FIG. 5 is a waveform diagram showing the recovered signals being produced in the real and imaginary channels of the carrier recovery loop circuit of FIG. 4.

Refer now to FIG. 5 shown a plurality of waveforms produced in the real and imaginary channels of the carrier recovery loop circuit of FIG. 4. The first waveform at line 18 is shown as the Y or real signal in the real channel and is applied as an input to the diode square law multiplier 56. The output of the multiplier 56 produces a real rectified signal on line 58 as shown in the second waveform. Similarly the imaginary signal in the X or imaginary channel at line 35 is shown as the third waveform which is applied to the square law multiplier 57 to produce the X channel rectified signal on output line 60 shown as the fourth waveforms of FIG. 5. The FIG. 5 loop error signal at line 25 is now applied to the low pass filter 53 having an output on line 54 which is applied to a third diode square law multiplier 55 that produces a smooth phase lock indicator component on line 59. The signal on line 59 is applied as a negative input to the three input summing circuit 65. Summing circuit 65 has two positive inputs on lines 63 and 64. The output of summing circuit 55 on line 46' is shown as the fifth waveform of FIG. 5 and includes a larger voltage component 66 which results from the summation of the signals on lines 63 and 64.

Figure 6:
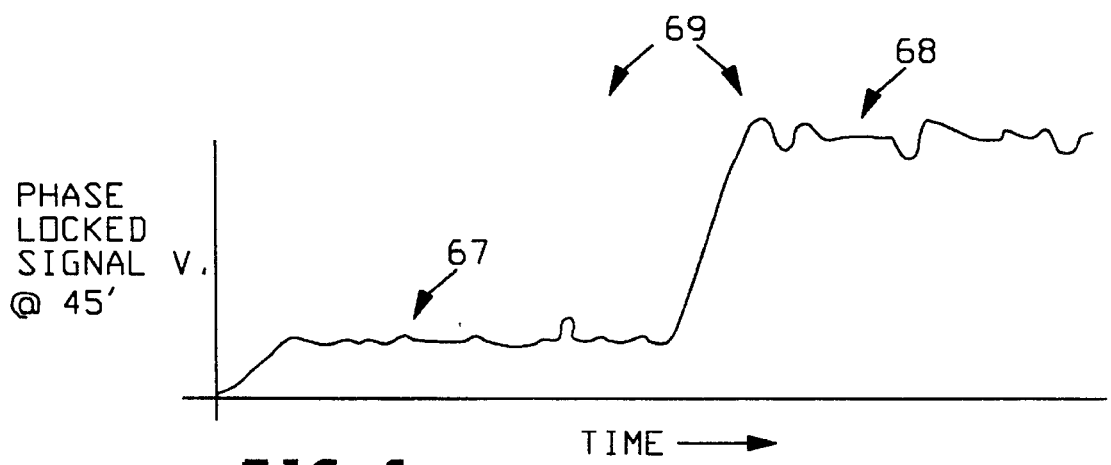
FIG. 6 is a waveform diagram showing a voltage waveform produced at the output of the phase locked indicator of FIG. 4.

Refer now to FIG. 6 showing the enhance signal to noise ratio signal on the output line 46' of summing circuit 65. It will now be appreciated that the large output sum on line 46', which resulted from the addition of the two positive inputs, has a not locked portion 67 which is widely separated from the locked portion 68 and both portions are relatively smooth.

Having explained a preferred embodiment of the present invention it will be understood that the waveforms shown in FIGS. 2 and 5 are occurring with a locked condition and that the waveforms 50 and 69 compare the output signals on lines 46 and 46' respectively which show the not locked portions 51 and 67 as well as the locked portions 52 and 68. Thus, it will be understood that the present invention improved phase locked indication circuit provides a greater signal to noise ratio and a more reliable locked and not locked condition free from aberrations that cause false readings. Further, this desirable result has been accomplished employing lower cost miniaturized high frequency components which are known to consume less power than components used herebefore.

We claim:

1. A phase locked indication circuit for a high frequency carrier recovery loop circuit, comprising:

a Costas QPSK carrier recovery loop circuit having a real channel, an imaginary channel and a phase error channel, a three input summing circuit having an output indicative of a locked or a not locked condition, two positive inputs and a negative input, a pair of high frequency diode multipliers, said real channel and said imaginary channel each being coupled through one of said high frequency diode multipliers to one of said two positive inputs of said three input summing circuit, said phase error channel being coupled to said negative input of said three input summing circuit through a diode multiplier having a low band pass characteristic for effectively separating the locked and the not locked conditions, each said diode multiplier providing a direct current output signal, a low pass filter connected in series between said phase error channel and the diode multiplier for reducing high frequency signals which cause false locked and not locked signals, whereby said locked and not locked signals have substantial voltage separation sufficient to avoid said false locked and not locked condition.

2. A phase locked indication circuit as set forth in claim 1 wherein said low pass filter comprises a selectable low bandwidth low pass filter for eliminating high frequency components in the phase error channel for diminishing false lock and not locked conditions.

3. A phase locked indication circuit as set forth in claim 2 wherein the output of said three input summing circuit comprises a unique voltage level signal for a locked and for a not locked condition.

4. A phase locked indication circuit as set forth in claim 1 wherein each of said diode multipliers provide low pass filtering of their input signals for eliminating signals which cause false locked and not locked conditions.

5. A phase lock indication circuit as set forth in claim 1 which further includes an amplifier connected in series between said diode multiplier and said positive inputs of said three input summing circuit in said real and imaginary channels.

6. A phase locked indication circuit as set forth in claim 1 wherein said real channel and said imaginary channel each comprise a double balance mixer having an output coupled to a summing circuit in said phase error channel, and said summing circuit having an error signal output coupled to said low pass filter.

7. A phase locked indication circuit for a high frequency carrier recovery loop circuit comprising:

a Costas carrier recovery loop circuit having three channels; a real signal channel, an imaginary signal channel and a phase error signal channel, a three input summing circuit having two positive inputs and one negative input and an output for generating output signals indicative of a locked or a not locked condition at high frequencies, above 50 megahertz, a first high frequency diode multiplier coupled in series between said real signal channel and a first positive input of said three input summing circuit, a second high frequency diode multiplier coupled in series between said imaginary signal channel and a second positive input of said three input summing circuit, said high frequency diode multipliers each having a low band pass characteristic for reducing high frequency signals, a low pass filter connected to said phase error signal channel for eliminating unwanted high frequency components in the phase error signal, and a square low multiplier connected to the output of said low pass filter and to the negative input of said three input summing circuit for effectively separating the output signals from said three input summing circuits indicative of a locked or a not locked condition and for eliminating false locked and not locked conditions.

8. A phase locked indicating circuit as set forth in claim 7 wherein said three input summing circuits comprises scaling amplifiers for amplifying the signals applied to said positive inputs.

9. A phase locked indicating circuit as set forth in claim 8 wherein said square low multiplier comprises a high frequency diode multiplier.

* * * * *